United States Patent
Hsu et al.

(10) Patent No.: US 9,318,186 B1
(45) Date of Patent: Apr. 19, 2016

(54) DRAM WORDLINE CONTROL CIRCUIT, DRAM MODULE AND METHOD OF CONTROLLING DRAM WORDLINE VOLTAGE

(71) Applicant: NANYA TECHNOLOGY CORPORATION, Tao-Yuan Hsien (TW)

(72) Inventors: Ting-Shuo Hsu, New Taipei (TW); Chih-Jen Chen, Kaohsiung (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 14/586,995

(22) Filed: Dec. 31, 2014

(51) Int. Cl.
G11C 7/00 (2006.01)
G11C 11/408 (2006.01)
G11C 11/406 (2006.01)
G11C 11/4091 (2006.01)
G11C 11/409 (2006.01)
G11C 5/14 (2006.01)

(52) U.S. Cl.
CPC ............ *G11C 11/4085* (2013.01); *G11C 5/147* (2013.01); *G11C 11/406* (2013.01); *G11C 11/409* (2013.01); *G11C 11/4091* (2013.01); *G11C 11/40615* (2013.01)

(58) Field of Classification Search
CPC .................. G11C 11/4074; G11C 1029/5602; G11C 29/56; G11C 29/56016; G11C 5/147
USPC ........ 365/191, 185.08, 226, 230.06, 203, 222
See application file for complete search history.

(56) References Cited

U.S. PATENT DOCUMENTS

| | | | | |
|---|---|---|---|---|
| 8,913,443 B2* | 12/2014 | Pyeon | ................. | H01L 25/0657 365/189.07 |
| 2012/0127798 A1* | 5/2012 | Gillingham | ............ | G11C 16/10 365/185.18 |
| 2013/0070540 A1* | 3/2013 | Pyeon | ................. | H01L 25/0657 365/189.07 |

\* cited by examiner

*Primary Examiner* — Gene Auduong
(74) *Attorney, Agent, or Firm* — CKC & Partners Co., Ltd.

(57) ABSTRACT

A DRAM wordline voltage control circuit includes a sensing module, an oscillator and a charging pump. The sensing module is configured to receive a first control signal and a feedback signal corresponding to a wordline voltage signal, and generate a second control signal according to the first control signal and the feedback signal corresponding to the wordline voltage signal. The oscillator is electrically connected with the sensing module. The oscillator is configured to receive the second control signal and output an oscillating signal when the second control signal is enabled. The charging pump is electrically connected with the oscillator. The charging pump is configured to increase a voltage value of the wordline voltage signal when the oscillator outputs the oscillating signal.

17 Claims, 5 Drawing Sheets

DRAM WORDLINE CONTROL CIRCUIT, DRAM MODULE AND METHOD OF CONTROLLING DRAM WORDLINE VOLTAGE

BACKGROUND

1. Technical Field

The present disclosure relates to DRAM modules. More particularly, the present disclosure relates to a DRAM wordline voltage control circuit.

2. Description of Related Art

With the advantages including low cost and high density, DRAM is widely used in electronic devices (e.g., laptop computers, tablet computers and smart phones). However, DRAM must be refreshed frequently, hundreds of times per second, in order to maintain the data stored in it. Consequently, additional power consumption is required in the electronic devices disposed with DRAM modules.

In order to meet the requirement of low power consumption for mobile devices, it is very important in this area to reduce the power consumption of DRAM modules.

SUMMARY

In one aspect, the present disclosure is related to a DRAM wordline voltage control circuit. The DRAM wordline voltage control circuit includes a sensing module, an oscillator and a charging pump. The sensing module is configured to receive a first control signal and a feedback signal corresponding to a wordline voltage signal, and generate a second control signal according to the first control signal and the feedback signal corresponding to the wordline voltage signal. The oscillator is electrically connected with the sensing module, The oscillator is configured to receive the second control signal and output an oscillating signal when the second control signal is enabled. The charging pump is electrically connected with the oscillator. The charging pump is configured to increase a voltage value of the wordline voltage signal when the oscillator outputs the oscillating signal.

In another aspect, the present disclosure is related to a method of controlling DRAM wordline voltage including the following steps: receiving a first control signal and a feedback signal corresponding to a wordline voltage signal, generating a second control signal according to the first control signal and the feedback signal corresponding to the wordline voltage signal; receiving the second control signal and outputting an oscillating signal when the second control signal is enabled; and increasing a voltage value of the wordline voltage signal when the oscillator outputs the oscillating signal.

In still another aspect, the present disclosure is related to a DRAM module. The DRAM module includes a sensing module, an oscillator and a charging pump. The sensing module is configured to receive a first control signal and a feedback signal corresponding to a wordline voltage signal, and generate a second control signal according to the first control signal and the feedback signal corresponding to the wordline voltage signal. The oscillator is electrically connected with the sensing module. The oscillator is configured to receive the second control signal and output an oscillating signal when the second control signal is enabled. The charging pump is electrically connected with the oscillator. The charging pump is configured to increase a voltage value of the wordline voltage signal when the oscillator outputs the oscillating signal.

By applying the techniques disclosed in the present disclosure, the power consumption of the DRAM wordline voltage control circuit can be reduced by 25.8%. Therefore, the power consumption in IDD6 of the DRAM module can be effectively reduced.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
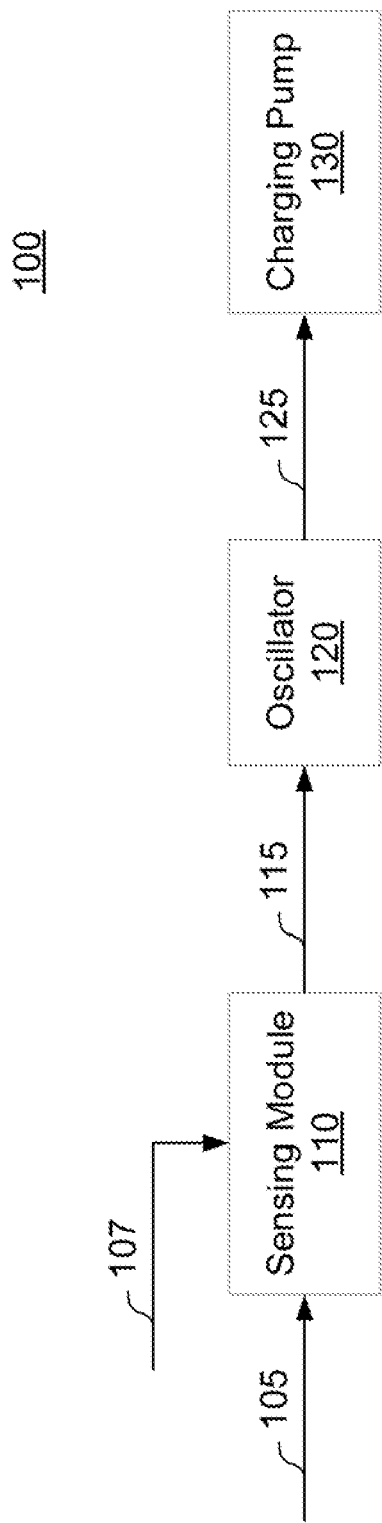
FIG. 1 is a schematic diagram of a DRAM wordline voltage control circuit in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Reference is made first to FIG. 1. FIG. 1 is a schematic diagram of a DRAM wordline voltage control circuit 100 in accordance with one embodiment of the present disclosure. According to one embodiment of the present disclosure, the DRAM wordline voltage control circuit 100 is disposed within a DRAM module (not depicted). The DRAM wordline voltage control circuit 100 includes a sensing module 110, an oscillator 120 and a charging pump 130.

The sensing module 110 is configured to receive a first control signal 105 and a feedback signal 107 corresponding to a wordline voltage signal (not depicted), and generate a second control signal 115 according to the first control signal 105 and the feedback signal 107 corresponding to the wordline voltage signal.

The oscillator 120 is electrically connected with the sensing module 110. The oscillator 120 is configured to receive the second control signal 115 and output an oscillating signal 125 when the second control signal 115 is enabled. The oscillating signal 125 can be a cycle pulse, but is not limited thereto.

The charging pump 130 is electrically connected with the oscillator 120. The charging pump 130 is configured to increase a voltage value of the abovementioned wordline voltage signal when the oscillator 120 outputs the oscillating signal 125.

According to one embodiment of the present disclosure, the sensing module 110 is further configured to set the second control signal 115 enabled when the first control signal 105 is enabled and the feedback signal 107 corresponding to the wordline voltage signal is smaller than a threshold voltage. The threshold voltage can be 3.2 volts, but is not limited thereto. Therefore, when the first control signal 105 is enabled and the feedback signal 107 corresponding to the wordline voltage signal' is smaller than the threshold voltage, the second control signal 115 received by the oscillator 120 is enabled Consequently, the oscillator 120 outputs the oscillating signal 125, and the charging pump 130 increases the voltage value of the wordline voltage signal.

According to one embodiment of the present disclosure, the first control signal is enabled during at least one DRAM refresh period. According to another embodiment of the present disclosure, the first control signal is enabled for a time duration within at least one DRAM refresh period. Consequently, if the feedback signal 107 corresponding to the wordline voltage signal is smaller than the threshold voltage during the at least one DRAM refresh period, the sensing module 110 sets the second control signal 115 enabled, and the charging pump 130 increases the voltage value of the wordline voltage signal.

According to one embodiment of the present disclosure, the first control signal 105 is disabled during at least one DRAM self-refresh period. According to another embodiment of the present disclosure, the first control signal 105 is disabled for a time duration within at least one DRAM self-refresh period. Therefore, even if the feedback signal 107 corresponding to the wordline voltage signal is smaller than the threshold voltage during the at least one DRAM self-refresh period, the oscillator 120 does not output the oscillating signal 125, and the charging pump 130 does not increase the voltage value of the wordline voltage signal. Consequently, the power consumption required to increase the voltage value of the wordline voltage signal can be saved during the at least one DRAM self-refresh period.

Figure 2:
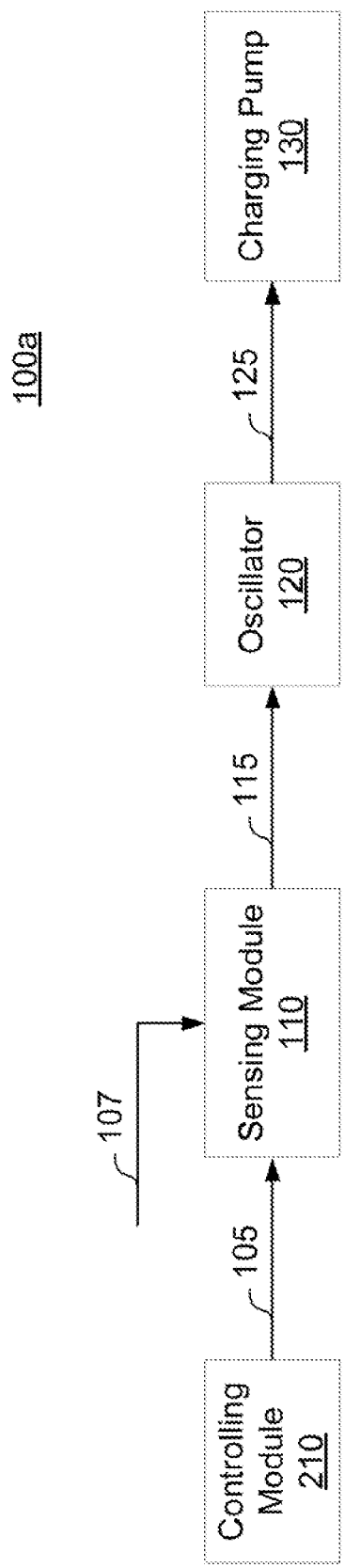
FIG. 2 is a schematic diagram of a DRAM wordline voltage control circuit in accordance with one embodiment of the present disclosure.

Reference is made also to FIG. 2. FIG. 2 is a schematic diagram of a DRAM wordline voltage control circuit 100a in accordance with one embodiment of the present disclosure. Compared with the DRAM wordline voltage control circuit 100 illustrated in FIG. 1, the DRAM wordline voltage control circuit 100a further includes a controlling module 210.

The controlling module 210 is electrically connected with the sensing module 110. The controlling module 210 is configured to generate the first control signal 105.

According to one embodiment of the present disclosure, the controlling module 210 is further configured to set the first control signal 105 enabled during at least one DRAM refresh period. According to another embodiment of the present disclosure, the controlling module 210 is configured to set the first control signal 105 disabled during at least one DRAM self-refresh period.

Figure 3:
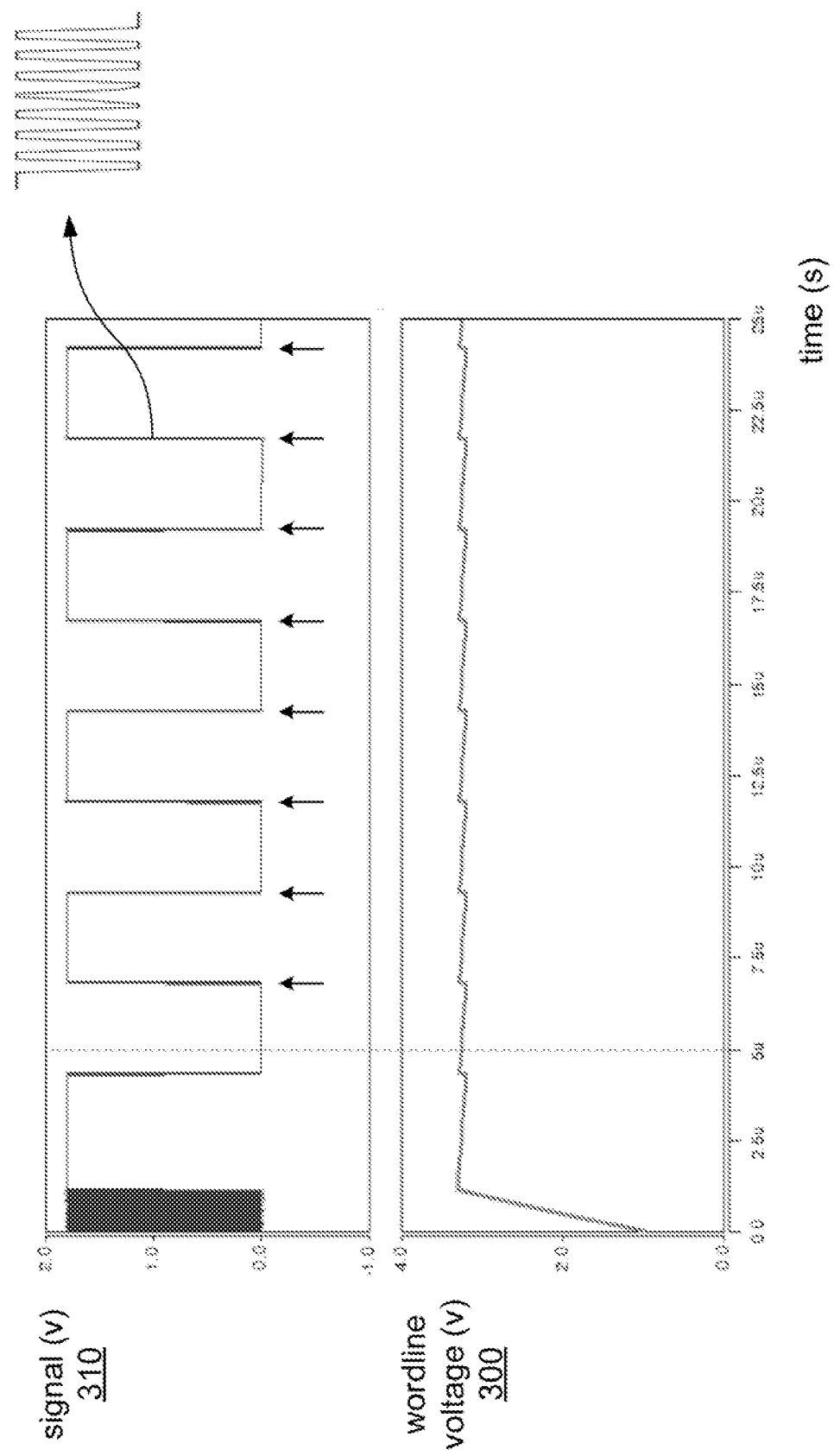
FIG. 3 illustrates the wordline voltage and the signal outputted from an oscillator for increasing the voltage value of the wordline voltage in a conventional DRAM wordline voltage control circuit.

Additional reference is made to FIG. 3. FIG. 3 illustrates the wordline voltage 300 and the signal 310 outputted from an oscillator for increasing the voltage value of the wordline voltage 300 in a conventional DRAM wordline voltage control circuit.

It can be seen from FIG. 3 that during the time period from 5 us to 25 us, the oscillator outputs oscillating signals for 8 times (which are indicated by the arrows as illustrated in FIG. 3), and the voltage value of the wordline voltage 300 are therefore increased for 8 times.

Figure 4:
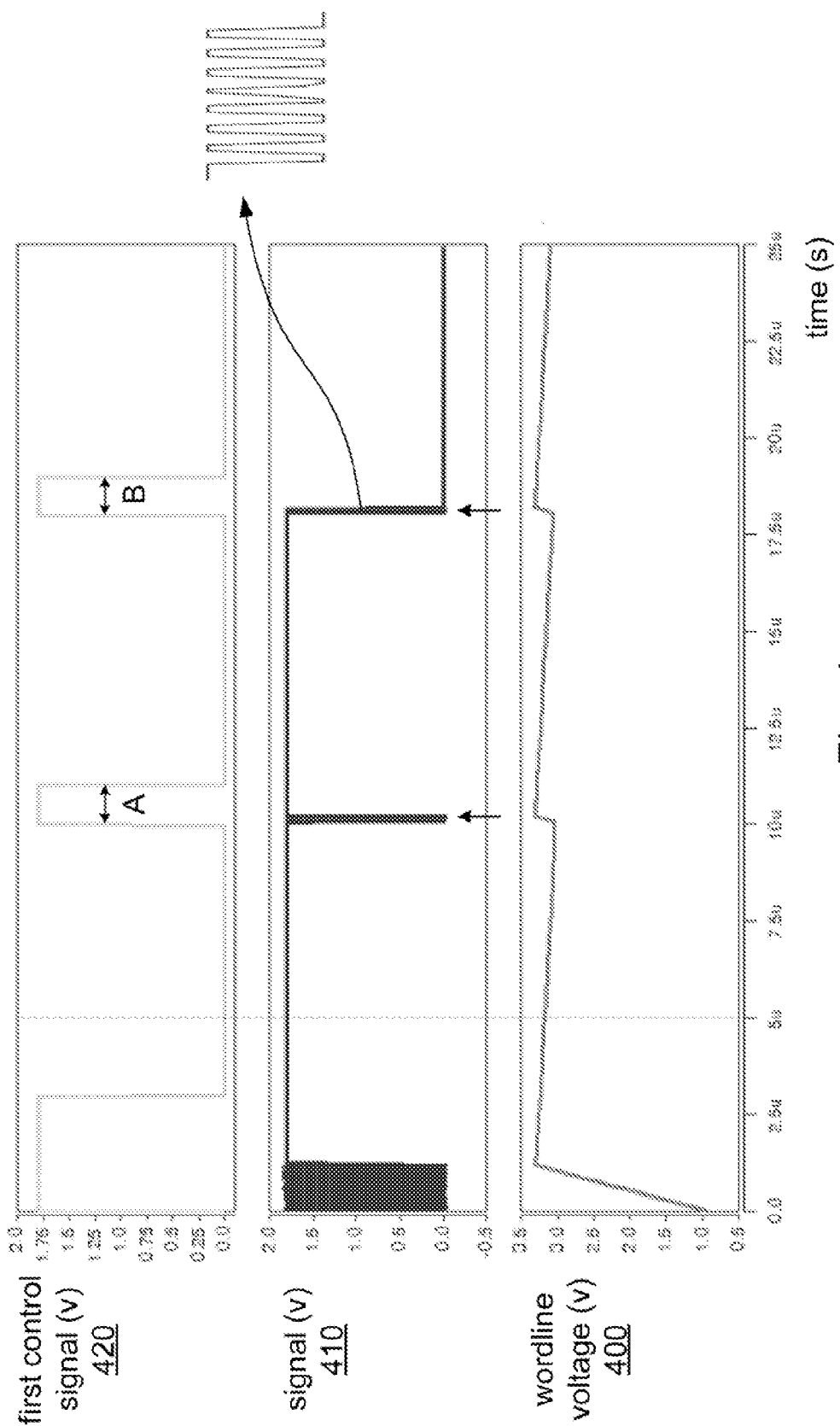
FIG. 4 illustrates the first control signal the wordline voltage and the signal outputted from an oscillator for increasing the voltage value of the wordline voltage in accordance with one embodiment of the present disclosure.

Reference is made to FIG. 4 simultaneously. FIG. 4 illustrates the first control signal 420, the wordline voltage 400 and the signal 410 outputted from an oscillator for increasing the voltage value of the wordline voltage 400 in accordance with one embodiment of the present disclosure.

It can be seen from FIG. 4 that during the time period from 5 us to 25 us, the first control signal is enabled in time periods A and B (the time periods A and B can be DRAM refresh periods or time duration within DRAM refresh periods). Consequently, the oscillator outputs oscillating signals for only 2 times (which are indicated by the arrows as illustrated in FIG. 4), and the voltage value of the wordline voltage 400 are therefore increased for only 2 times. According to experimental results, the power consumption of the DRAM wordline voltage control circuit can be reduced by 25.8%.

Figure 5:
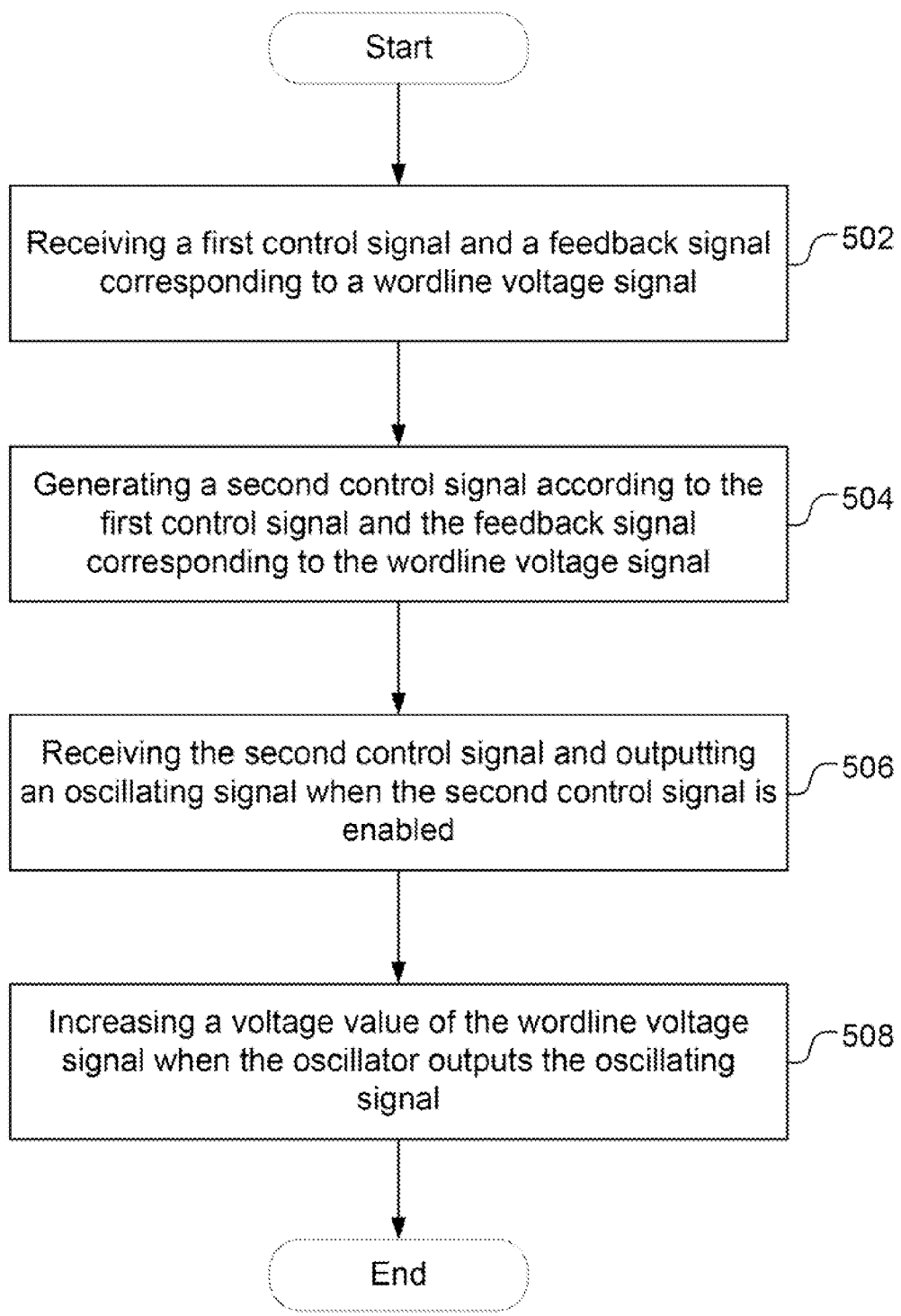
FIG. 5 is a flow chart of a method of controlling DRAM wordline voltage in accordance with one embodiment of the present disclosure.

Reference is now made to FIG. 5. FIG. 5 is a flow chart of a method of controlling DRAM wordline voltage in accordance with one embodiment of the present disclosure. The method of controlling DRAM wordline voltage may be implemented by the DRAM wordline voltage control circuit 100 illustrated in 1, but is not limited in this regard. For convenience and clarity, it is assumed that the method of controlling DRAM wordline voltage is implemented by the DRAM wordline voltage control circuit 100 illustrated in FIG. 1.

In step 502, the sensing module 110 receives a first control signal 105 and a feedback signal 107 corresponding to a wordline voltage signal. The in step 504, the sensing module 110 generates a second control signal 115 according to the first control signal 105 and the feedback signal 107 corresponding to the wordline voltage signal.

In step 506, the oscillator 120 receives the second control signal 115 and outputs an oscillating signal 125 when the second control signal 115 is enabled. In step 508, the charging pump 130 increases a voltage value of the wordline voltage signal when the oscillator 120 outputs the oscillating signal 125.

The above illustrations include exemplary operations, but the operations are not necessarily performed in the order shown. Operations may be added, replaced, changed order, and/or eliminated as appropriate, in accordance with the spirit and scope of various embodiments of the present disclosure.

By applying the techniques disclosed in the present disclosure, the power consumption of the DRAM wordline voltage control circuit can be reduced by 25.8%. Therefore, the power consumption in IDD6 of the DRAM module can be effectively reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A DRAM wordline voltage control circuit, comprising:
a sensing module configured to receive a first control signal and a feedback signal corresponding to a wordline voltage signal, and generate a second control signal according to the first control signal and the feedback signal corresponding to the wordline voltage signal, wherein the sensing module is further configured to set the second control signal enabled when the first control signal is enabled and the feedback signal corresponding to the wordline voltage signal is smaller than a threshold voltage;
an oscillator electrically connected with the sensing module, the oscillator being configured to receive the second control signal and output an oscillating signal when the second control signal is enabled; and
a charging pump electrically connected with the oscillator, the charging pump being configured to increase a voltage value of the wordline voltage signal when the oscillator outputs the oscillating signal.

2. The DRAM wordline voltage control circuit of claim 1, wherein the first control signal is enabled during at least one DRAM refresh period.

3. The DRAM wordline voltage control circuit of claim 1, wherein the first control signal is enabled for a time duration within at least one DRAM refresh period.

4. The DRAM wordline voltage control circuit of claim 1, wherein the first control signal is disabled during at least one DRAM self-refresh period.

5. The DRAM wordline voltage control circuit of claim 1, wherein the first control signal is disabled for a time duration within at least one DRAM self-refresh period.

6. The DRAM wordline voltage control circuit of claim 1, further comprising:
a controlling module electrically connected with the sensing module, the controlling module being configured to generate the first control signal.

7. The DRAM wordline voltage control circuit of claim 4, wherein the controlling module is further configured to set the first control signal enabled during at least one DRAM refresh period.

8. The DRAM wordline voltage control circuit of claim 7, wherein the controlling module is configured to set the first control signal disabled during at least one DRAM self-refresh period.

9. A method of controlling DRAM wordline voltage, comprising:
receiving a first control signal and a feedback signal corresponding to a wordline voltage signal;
generating a second control signal according to the first control signal and the feedback signal corresponding to the wordline voltage signal, wherein the step further comprises:
setting the second control signal enabled when the first control signal is enabled and the feedback signal corresponding to the wordline voltage signal is smaller than a threshold voltage;
receiving the second control signal and outputting an oscillating signal when the second control signal is enabled; and
increasing a voltage value of the wordline voltage signal when the oscillating signal is outputted.

10. The method of claim 9, wherein the first control signal is enabled during at least one DRAM refresh period.

11. The method of claim 9, wherein the first control signal is disabled during at least one DRAM self-refresh period.

12. A DRAM module, comprising:
a sensing module configured to receive a first control signal and a feedback signal corresponding to a wordline voltage signal, and generate a second control signal according to the first control signal and the feedback signal corresponding to the wordline voltage signal, wherein the sensing module is further configured to set the second control signal enabled when the first control signal is enabled and the feedback signal corresponding to the wordline voltage signal is smaller than a threshold voltage;
an oscillator electrically connected with the sensing module, the oscillator being configured to receive the second control signal and output an oscillating signal when the second control signal is enabled; and
a charging pump electrically connected with the oscillator, the charging pump being configured to increase a voltage value of the wordline voltage signal when the oscillator outputs the oscillating signal.

13. The DRAM module of claim 12, wherein the first control signal is enabled during at least one DRAM refresh period.

14. The DRAM module of claim 12, wherein the first control signal is disabled during at least one DRAM self-refresh period.

15. The DRAM module of claim 12, further comprising:
a controlling module electrically connected with the sensing module, the controlling module being configured to generate the first control signal.

16. The DRAM module of claim 15, wherein the controlling module is further configured to set the first control signal enabled during at least one DRAM refresh period.

17. The DRAM module of claim 15, wherein the controlling module is configured to set the first control signal disabled during at least one DRAM self-refresh period.

* * * * *